United States Patent
Ding et al.

(10) Patent No.: US 7,110,258 B2
(45) Date of Patent: Sep. 19, 2006

(54) HEAT DISSIPATING MICRODEVICE

(75) Inventors: Pei-Pei Ding, Hsin-Chuang (TW); Chang-Chi Lee, Taipei (TW); Jao-Ching Lin, Hsin-Chuang (TW)

(73) Assignee: Asia Vital Components Co., Ltd., Kaohsiung (TW)

( * ) Notice: Subject to any disclaimer, the term of this patent is extended or adjusted under 35 U.S.C. 154(b) by 285 days.

(21) Appl. No.: 10/740,496

(22) Filed: Dec. 22, 2003

(65) Prior Publication Data

US 2005/0006115 A1 Jan. 13, 2005

(30) Foreign Application Priority Data

Jul. 4, 2003 (TW) ................................. 92118323

(51) Int. Cl.
*H05K 7/20* (2006.01)
(52) U.S. Cl. .............. 361/699; 361/704; 361/720; 361/721; 361/719; 174/15.1
(58) Field of Classification Search ............... 174/15.1, 174/15.6, 8, 47; 361/711, 274.2, 285, 676, 361/677–678, 687–701, 704, 707, 719–720; 165/80.4, 104.19, 104.26, 104.33, 104.21; 257/714–716, 712
See application file for complete search history.

(56) References Cited

U.S. PATENT DOCUMENTS

| | | | | |
|---|---|---|---|---|
| 5,388,635 A | * | 2/1995 | Gruber et al. ............. | 165/80.4 |
| 5,719,444 A | * | 2/1998 | Tilton et al. ................ | 257/714 |
| 6,124,632 A | * | 9/2000 | Lo et al. ..................... | 257/678 |
| 6,279,336 B1 | * | 8/2001 | Grundl et al. ............. | 62/259.2 |
| 6,501,654 B1 | * | 12/2002 | O'Connor et al. .......... | 361/699 |
| 6,934,154 B1 | * | 8/2005 | Prasher et al. ............. | 361/699 |
| 6,942,018 B1 | * | 9/2005 | Goodson et al. ........... | 165/80.4 |
| 6,988,534 B1 | * | 1/2006 | Kenny et al. .............. | 165/80.4 |
| 6,989,989 B1 | * | 1/2006 | Brasz et al. ................ | 361/699 |
| 2004/0040695 A1 | * | 3/2004 | Chesser et al. ........ | 165/104.21 |
| 2004/0052049 A1 | * | 3/2004 | Wu et al. .................... | 361/699 |
| 2004/0120827 A1 | * | 6/2004 | Kim et al. ................... | 417/48 |
| 2005/0141195 A1 | * | 6/2005 | Pokharna et al. ........... | 361/699 |

* cited by examiner

*Primary Examiner*—Kamand Cuneo
*Assistant Examiner*—Hoa C. Nguyen
(74) *Attorney, Agent, or Firm*—Lowe Hauptman & Berner, LLP

(57) ABSTRACT

A heat dissipating microdevice includes a board, a fluid microsystem, and a coolant. The board includes an insulator layer that has first and second surfaces, a conductor layer formed on the first surface, and a cover member disposed on the second surface. The fluid microsystem is formed in the insulator layer of the board, and includes first and second micro-channel structures, and first and second micro-conduit structures that permit fluid communication between the first and second micro-channel structures. The coolant is contained in the fluid microsystem, and flows from the second micro-channel structure to the first micro-channel structure through the first micro-conduit structure, and from the first micro-channel structure back to the second micro-channel structure through the second micro-conduit structure.

19 Claims, 12 Drawing Sheets

HEAT DISSIPATING MICRODEVICE

CROSS-REFERENCE TO RELATED APPLICATION

This application claims priority of Taiwanese application no. 092118323, filed on Jul. 4, 2003.

BACKGROUND OF THE INVENTION

1. Field of the Invention

The invention relates to a heat dissipating microdevice, more particularly to a heat dissipating microdevice including a fluid microsystem formed in a insulator layer of a board.

2. Description of the Related Art

In German Patent Nos. DE19739719 and DE19739722, there is disclosed a conventional method of making a hollow microstructure using first and second circuit boards. Each of the first and second circuit boards includes an insulator layer that has first and second surfaces, and a conductor layer formed on the first surface of the insulator layer. The method comprises the steps of forming recesses in the conductor layer of the first circuit board and bonding the second surface of the insulator layer of the second circuit board on the conductor layer of the first circuit board to form the hollow microstructure. Although the method proposed therein permits hollow microstructure fabrication, since the resulting hollow microstructure is disposed in between the insulator layers, it is not suitable for heat dissipating applications.

SUMMARY OF THE INVENTION

Therefore, the object of the present invention is to provide a heat dissipating microdevice that includes a fluid microsystem formed in an insulator layer of a board and that is applicable for absorbing and dissipating heat.

Another object of the present invention is to provide a method of making the inventive heat dissipating microdevice.

According to one aspect of the present invention, a heat dissipating microdevice comprises aboard, a fluid microsystem, and a coolant. The board includes an insulator layer that has a first surface and a second surface opposite to the first surface in a first direction, a conductor layer formed on the first surface, and a cover member disposed on the second surface. The board has a first area and a second area opposite to the first area in a second direction transverse to the first direction. The first area is adapted to be placed in thermal contact with a heat source. The fluid microsystem is formed in the insulator layer of the board, and includes first and second micro-channel structures, and first and second micro-conduit structures. The first and second micro-channel structures are disposed respectively in the first and second areas of the board. At least one of the first and second micro-channel structures is bounded by at least one of the conductor layer and the cover member. The first and second micro-conduit structures permit fluid communication between the first and second micro-channel structures. The first micro-conduit structure includes a first end section that is in fluid communication with the second micro-channel structure, and a second end section that extends to and that is in fluid communication with the first micro-channel structure. The second micro-conduit structure includes a first end section that is in fluid communication with the first micro-channel structure, and a second end section that extends to and that is in fluid communication with the second micro-channel structure. The coolant is contained in the fluid microsystem, and flows from the second micro-channel structure to the first micro-channel structure through the first micro-conduit structure, and from the first micro-channel structure back to the second micro-channel structure through the second micro-conduit structure.

According to another aspect of the present invention, a method of making a heat dissipating microdevice comprises the steps of: providing a board that includes an insulator layer having a first surface and a second surface opposite to the first surface, and a conductor layer formed on the first surface of the insulator layer; forming a hole unit in the insulator layer that extends from the first surface to the second surface of the insulator layer to result in a fluid microsystem; and disposing a cover member on the second surface of the insulator layer. The fluid microsystem includes first and second micro-channel structures disposed respectively in first and second areas of the board and bounded by the conductor layer, and first and second micro-conduit structures that permit fluid communication between the first and second micro-channel structures. The first micro-conduit structure includes a first end section that is in fluid communication with the second micro-channel structure, and a second end section that extends to and that is in fluid communication with the first micro-channel structure. The second micro-conduit structure includes a first end section that is in fluid communication with the first micro-channel structure, and a second end section that extends to and that is in fluid communication with the second micro-channel structure.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
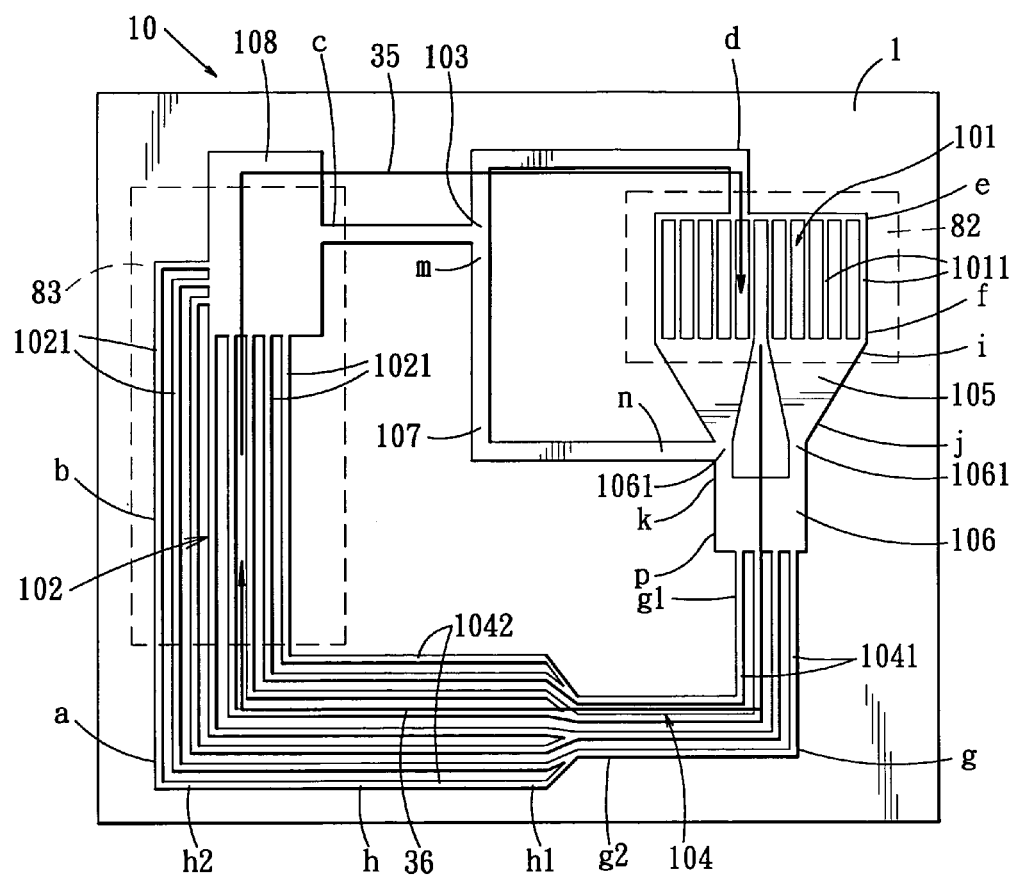
FIG. 1 is a schematic view of the first preferred embodiment of a heat dissipating microdevice according to this invention.

Before the present invention is described in greater detail, it should be noted that like elements are denoted by the same reference numerals throughout the disclosure.

Figure 2:
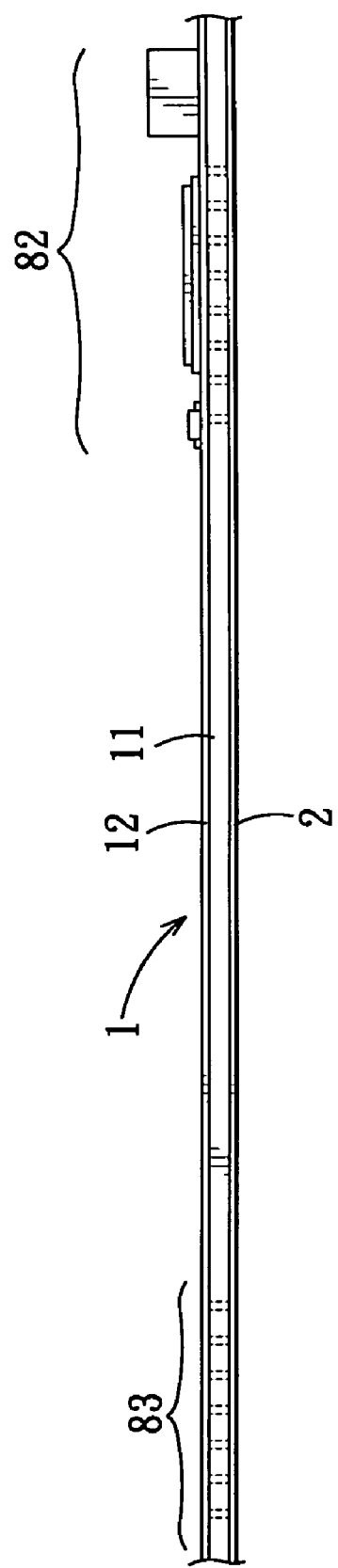
FIG. 2 is a schematic view to illustrate a board of the preferred embodiment.

Referring to FIGS. 1 and 2, the first preferred embodiment of a heat dissipating microdevice according to this invention is shown to include a board 1, a fluid microsystem 10, and a coolant.

The board 1 includes a first insulator layer 11 that has a first surface and a second surface opposite to the first surface in a first direction, a first conductor layer 12 formed on the first surface, and a cover member 2 disposed on the second surface. The board 1 has a first area 82 and a second area 83 opposite to the first area 82 in a second direction transverse to the first direction. The first area 82 is adapted to be placed in thermal contact with a heat source (not shown). Preferably, the first insulator layer 11 is made from epoxy resin. Moreover, the cover member 2 is preferably made of a material the same as that of the first conductor layer 12. Alternatively, the cover member 2 may be made of a material the same as that of the first insulator layer 11 or glass. Further, the heat source is preferably an electronic component, such as an integrated circuit (IC).

The fluid microsystem 10 includes first and second micro-channel structures 101, 102 that are disposed respectively in the first and second areas 82, 83 of the board 1, and first and second micro-conduit structures 103, 104 that permit fluid communication between the first and second micro-channel structures 101, 102.

The coolant is contained in the fluid microsystem 10. As indicated by arrow 35, the coolant flows from the second micro-channel structure 102 to the first micro-channel structure 101 through the first micro-conduit structure 103, and, as indicated by arrow 36, from the first micro-channel structure 101 back to the second micro-channel structure 102 through the second micro-conduit structure 104. Preferably, the coolant is distilled water. Alternatively, the coolant can be one of de-ionized water, air, methanol, and acetone.

The preferred configuration of the fluid microsystem 10 will be described in greater detail in the succeeding paragraphs.

Each of the first and second micro-channel structures 101, 102 includes a plurality of parallel channels 1011, 1021, each of which includes first and second end portions (e), (a), (f), (b).

Each of the first and second micro-conduit structures 103, 104 includes first and second end sections (c), (g), (d), (h). The first end section (c) of the first micro-conduit structure 103 is in fluid communication with the second end portions (b) of the channels 1021 of the second micro-channel structure 102. The second end section (d) of the first micro-conduit structure 103 extends to and is in fluid communication with the first end portions (e) of the channels 1011 of the first micro-channel structure 101. The first end section (g) of the second micro-conduit structure 104 includes a plurality of parallel first conduits 1041, each of which has first and second end portions (g1), (g2). The first end portion (g1) of each of the first conduits 1041 is in fluid communication with the channels 1011 of the first micro-channel structure 101. The second end portion (g2) of each of the first conduits 1041 is bifurcated to form a pair of branches. The second end section (h) of the second micro-conduit structure 104 includes a plurality of parallel second conduits 1042, each of which has first and second end portions (h1), (h2). The first end portion (h1) of each of the second conduits 1042 extends from one of the branches of a respective one of the first conduits 1041. The second end portion (h2) of the second conduits 1042 extends to and is in fluid communication with the first end portion (a) of a respective one of the channels 1021 of the second micro-channel structure 102.

The fluid microsystem 10 further includes a receiving microstructure 105 that is disposed between and that permits fluid communication between the first micro-channel structure 101 and the second micro-conduit structure 104, and that includes first and second end portions (i), (j). In this embodiment, the receiving microstructure 105 has a diverging section that serves as the first end portion (i), and a converging section that serves as the second end portion (j). The first end portion (i) of the receiving microstructure 105 extends to and is in fluid communication with the first micro-channel structure 101, i.e., the second end portions (f) of the channels 1011 of the first micro-channel structure 101 extend to the first end portion (i) of the receiving microstructure 105.

The fluid microsystem 10 further includes a mixing microstructure 106 that is disposed between and that permits fluid communication between the receiving microstructure 105 and the second micro-conduit structure 104, and that includes first and second end portions (k), (p). In this embodiment, the first end portion (k) of the mixing microstructure 106 includes a pair of micro-passage structures 1061 that extend to and that are in fluid communication with the second end portion (j) of the receiving microstructure 105. The second end portion (p) of the mixing microstructure 106 extends to and is in fluid communication with the first end section (g) of the second micro-conduit structure 104, i.e., the first end portions (g1) of the first conduits 1041 of the first end section (g) of the second micro-conduit structure 104 extend to and are in fluid communication with the second end portion (p) of the mixing microstructure 106.

The fluid microsystem 10 further includes a third microconduit structure 107 that is disposed between and that permits fluid communication between the first micro-conduit structure 103 and the mixing microstructure 106, and that includes first and second end portions (m), (n). In this embodiment, the first end portion (m) of the third microconduit structure 107 extends to the first end section (c) of the first micro-conduit structure 103. The second end portion (n) of the third micro-conduit structure 107 extends to one of the micro-passage structures 1061 of the first end portion (k) of the mixing microstructure 106. The construction as such permits the coolant to flow from the second micro-channel structure 102 to the mixing microstructure 106 through the third micro-conduit structure 107 without passing through the first micro-channel structure 101. In an alternative embodiment, the fluid microsystem 10 is dispensed with both the mixing microstructure 106 and the third micro-conduit structure 107.

The fluid microsystem 10 further includes a micro-reservoir structure 108 that is disposed between and that is in fluid communication with the second micro-channel structure 102 and the first micro-conduit structure 103. In this embodiment, the channels 1021 of the second micro-channel structure 102 extend between the micro-reservoir structure 108 and a respective one of the second end portions (h2) of the second conduits 1042 of the second section (h) of the second micro-conduit structure 104. The first end portion (c) of the first micro-conduit structure 103 extends to and is in fluid communication with the micro-reservoir structure 108.

It is noted that each of the first conduits 1041 has a cross-section larger than that of each of the second conduits 1042. As such, the second end section (h) of the second micro-conduit structure 104 has a capillary effect that is greater than that of the first end section (g) of the second micro-conduit structure 104. Moreover, the micro-reservoir structure 108 has a cross-section larger than those of each of the channels 1021 of the second micro-channel structure 102 and the first micro-conduit structure 103. As such, the coolant flowing from the second micro-channel structure 102 to the first micro-channel structure 101 through the first micro-conduit structure 103 is first accumulated in the micro-reservoir structure 108. Further, the receiving microstructure 105 has a largest cross-section larger than those of each of the channels 1011 of the first micro-channel structure 101, each of the first and second conduits 1041, 1042 of the second micro-conduit structure 104, and that of the mixing microstructure 106.

In the preferred embodiment, the fluid microsystem 10 is bounded by both the first conductor layer 12 and the cover member 2. This will become apparent in the succeeding paragraphs.

It is further noted that the number of channels 1011 of the first micro-channel structure 101 can be made as many as possible so as to maximize contact area between the first micro-channel structure 101 and the first conductor layer 12.

In use, when the heat dissipating microdevice is disposed such that the first area 82 is in thermal contact with the heat source, the coolant in the first micro-channel structure 101 absorbs heat generated by the heat source. Once the coolant in the first micro-channel structure 101 reaches its boiling point, it quickly vaporizes. As soon as the coolant vaporizes, the vaporized coolant starts flowing to the receiving microstructure 105. Consequently, the coolant in the first microconduit structure 103 flows to the first micro-channel structure 101, the coolant in the micro-reservoir structure 108 flows to the first micro-conduit structure 103, and the coolant in the second micro-channel structure 102 flows to the micro-reservoir structure 108. At this time, the vaporized coolant flows through the receiving microstructure 105 at an increasing speed. By the time the vaporized coolant reaches the mixing microstructure 106, the vaporized coolant flows substantially a very high speed, thus creating a low pressure level in the mixing microstructure 106. Accordingly, the coolant in the third micro-conduit structure 107 is drawn into the mixing microstructure 106. Subsequently, the vaporized coolant mixes and exchanges heat with the coolant from the third micro-conduit structure 107 by convection, is cooled considerably, and condenses. The mixed coolant then flows to the second micro-conduit structure 104 and, finally, to the second micro-channel structure 102. By this time, the absorbed heat is completely dissipated.

Figure 3:
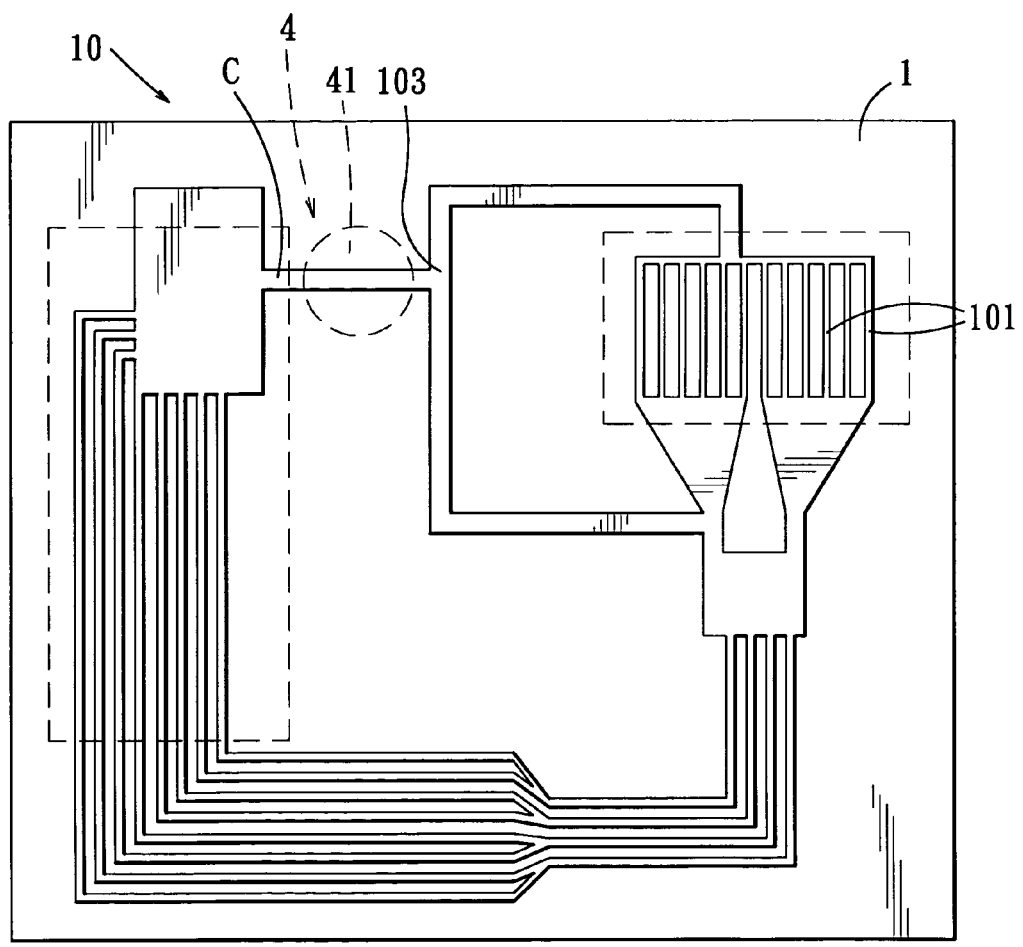
FIG. 3 is a schematic view of the second preferred embodiment of a heat dissipating microdevice according to this invention.

FIG. 3 illustrates the second preferred embodiment of a heat dissipating microdevice according to the present invention. When compared with the previous preferred embodiment, the heat dissipating microdevice further comprises a flow controller 4. In this embodiment, the flow controller 4 includes a micro-driving member 41, such as a micro-pump, that is mounted on the board 1, that is in fluid communication with the first end section (c) of the first micro-conduit structure 103, and that is operable so as to induce flow of the coolant in the fluid microsystem 10. The construction as such permits flow of the coolant even before the coolant in the first micro-channel structure 101 is vaporized.

Figure 4:
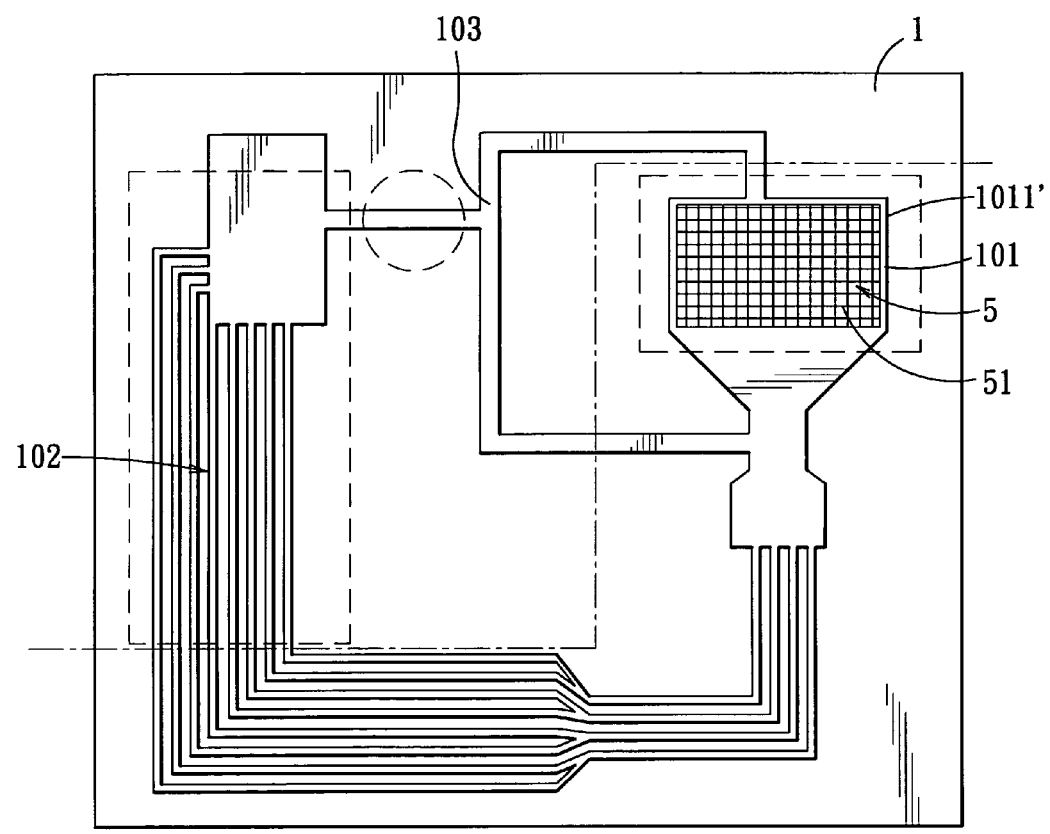
FIG. 4 is a schematic view of the third preferred embodiment of a heat dissipating microdevice according to this invention.
Figure 5:
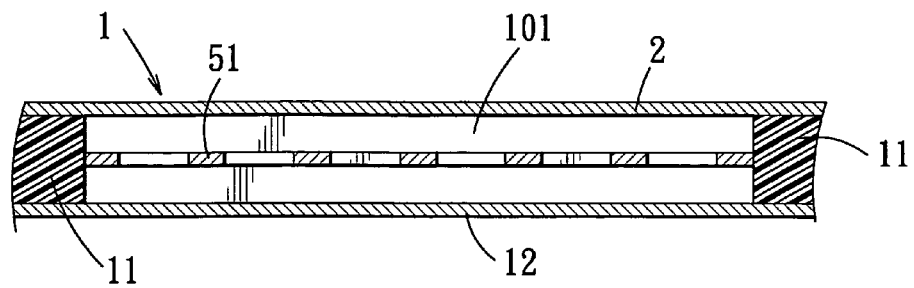
FIG. 5 is a fragmentary sectional view to illustrate a metallic grid microstructure disposed in a first micro-channel structure.
Figure 6:
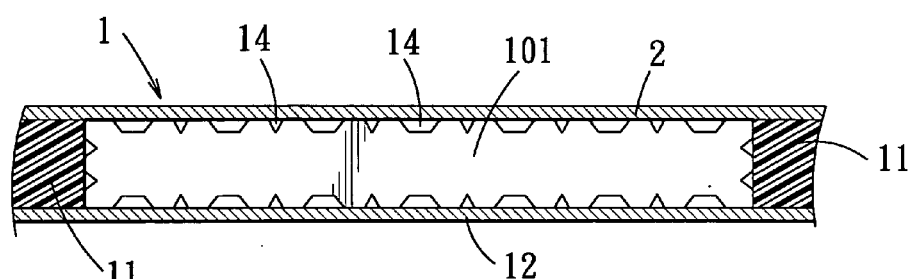
FIG. 6 is a fragmentary sectional view to illustrate a plurality of capillary protrusions formed in the first micro-channel structure.

FIGS. 4 and 5 illustrate the third preferred embodiment of a heat dissipating microdevice according to the present invention. When compared with the previous preferred embodiment, the heat dissipating microdevice further comprises a micro-capillary member 5. The first micro-channel structure 101 includes only one channel 1011'. In this embodiment, the micro-capillary member 5 includes a metallic grid microstructure 51 that is disposed in the channel 1011' of the first micro-channel structure 101 and that provides a capillary action. As such, the flow of the coolant from the second micro-channel structure 102 to the first micro-channel structure 101 through the first microconduit structure 103 can be enhanced. In an alternative embodiment, with further reference to FIG. 6, the microcapillary member 5 includes a plurality of capillary protrusions 14 formed on the cover member 2, the first conductor layer 12, and the wall defining the channel 1011' of the first micro-channel structure 101.

Figure 7:
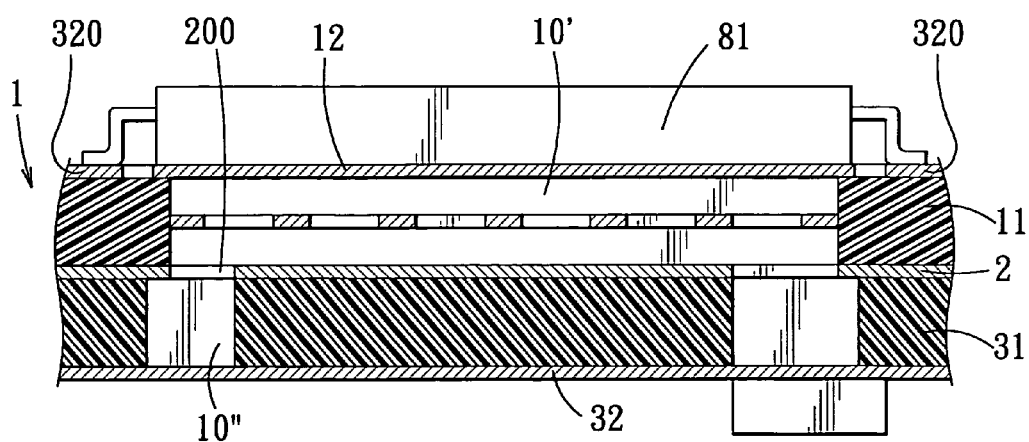
FIG. 7 is a fragmentary sectional view of the fourth preferred embodiment of a heat dissipating microdevice according to this invention.

With further reference to FIG. 7, the fourth preferred embodiment of a heat dissipating microdevice according to the present invention is shown. When compared with the previous preferred embodiment, the board 1 further includes a second insulator layer 31 and a second conductor layer 32. The second insulator layer 31 has first and second surfaces, and is disposed on the cover member 2 such that the first surface of the second insulator layer 31 abuts against the cover member 2. The second conductor layer 32 is disposed on the second surface of the second insulator layer 31. In this embodiment, a part of the fluid microsystem 10, which is herein referred to as a primary fluid microsystem member 10' is formed in the first insulator layer 11, whereas another part of the fluid microsystem 10, which is herein referred to as a secondary fluid microsystem member 10", is formed in the second insulator layer 31. In this embodiment, with reference to FIG. 1, the primary fluid microsystem member 10' includes the first micro-channel structure 101, the receiving microstructure 105, the mixing microstructure 106, and the second micro-conduit structure 104, whereas the secondary fluid microsystem member 10" includes the second micro-channel structure 102, the micro-reservoir structure 108, the first micro-conduit structure 103, and the third micro-conduit structure 107. The cover member 2 is formed with a communicating hole unit 200 so as to permit fluid communication between the first micro-channel structure 101 and the first micro-conduit structure 103, and between the second micro-channel structure 102 and the second micro-conduit structure 104. Circuit traces 320 are formed on the first conductor layer 12. The integrated circuit 81 is electrically connected, such as by soldering, to the circuit traces 320.

Figure 8:
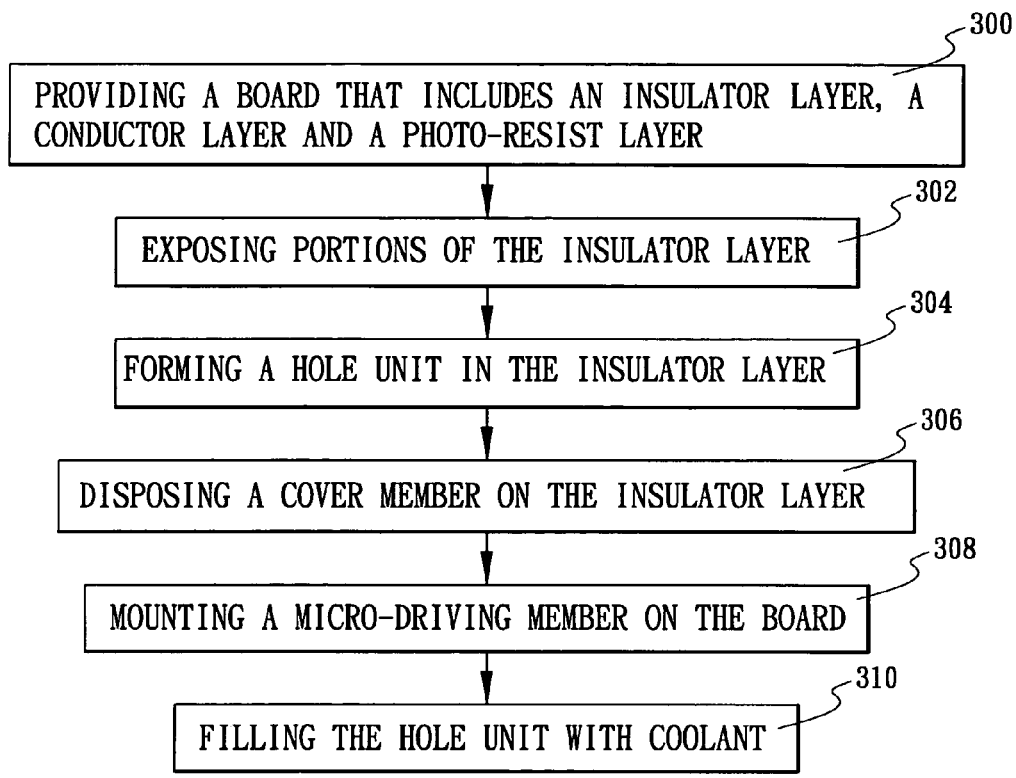
FIG. 8 is a flowchart of the first preferred embodiment of a method of making the heat dissipating microdevice according to the present invention.

The preferred embodiment of a method for making the heat dissipating microdevice of FIG. 3 includes the steps shown in FIG. 8.

Figure 9:
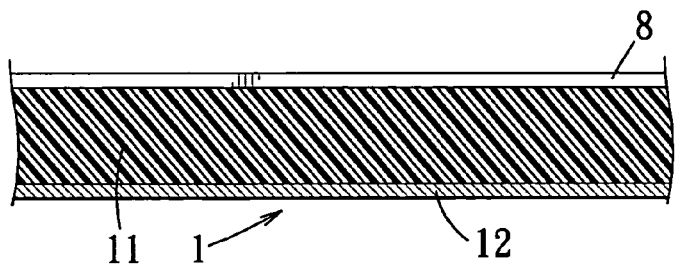
FIG. 9 is a fragmentary sectional view to illustrate a board having an insulator layer, and a conductor layer prepared according to the method of the first preferred embodiment.

In step 300, with further reference to FIG. 9, the board 1 is provided. The board 1 includes the insulator layer 11 that has the first surface and the second surface opposite to the first surface, the conductor layer 12 formed on the first surface of the insulator layer 11, and a photo-resist layer 8 coated on the second surface of the insulator layer 11.

Figure 10:
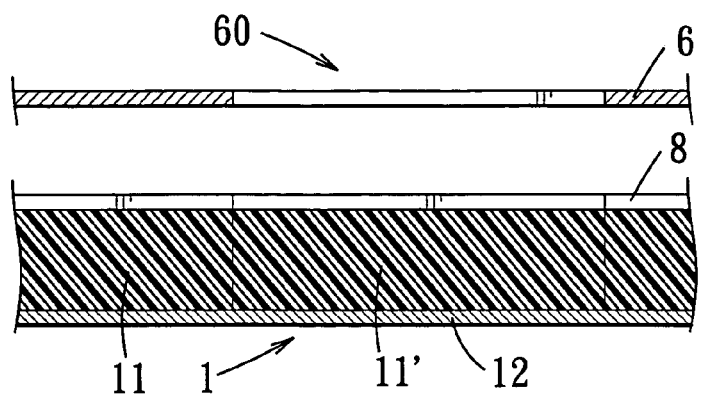
FIG. 10 is a fragmentary sectional view to illustrate how the insulator layer of the board of FIG. 9 is patterned in the method of the first preferred embodiment.

In step 302, with further reference to FIG. 10, the photo-resist layer 8 is patterned to expose portions 11' of the second surface of the insulator layer 11. In this step, a photo-mask 6 is formed with a pattern 60 corresponding to the fluid microsystem 10 (see FIG. 3) described hereinabove in connection with the second embodiment. The board 1 is subsequently exposed to radiation for transferring the pattern 60 on the photo-mask 6 to the photo-resist layer 8. A developing solution is used to form recesses in the photo-resist layer 8 corresponding to the pattern 60.

Figure 11:
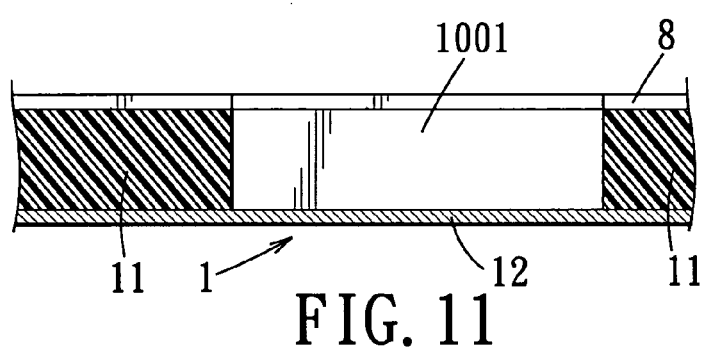
FIG. 11 is a fragmentary sectional view to illustrate how a hole unit is formed in the insulator layer of the board of FIG. 10 according to the method of the first preferred embodiment.

In step 304, with further reference to FIG. 11, a hole unit 1001 is formed in the exposed portions 11' (see FIG. 10) of the second surface of the insulator layer 11. The hole unit 1001 extends from the first surface to the second surface of the insulator layer 11 so as to result in the fluid microsystem bounded by the conductor layer 12. Preferably, the hole unit 1001 is formed by dry etching. Alternatively, the hole unit 1001 can be formed by wet etching or laser ablation.

Figure 12:
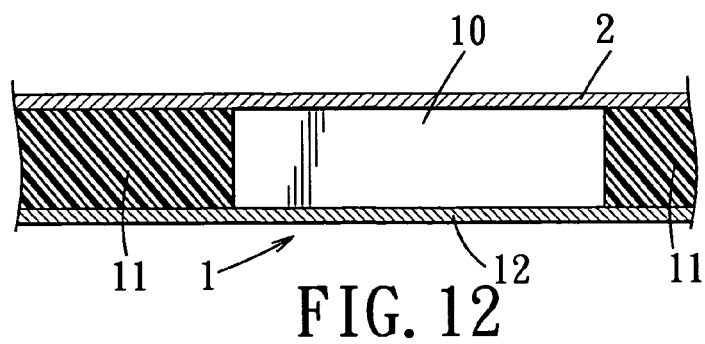
FIG. 12 is a fragmentary sectional view to illustrate how a cover member is disposed on the insulator layer of the board of FIG. 11 according to the method of the first preferred embodiment.

In step 306, with further reference to FIG. 12, the cover member 2 is disposed on the second surface of the insulator layer 11 to seal the fluid microsystem 10.

In step 308, the micro-driving member 41 (see FIG. 3) is mounted on the board 1.

In step 310, the fluid microsystem 10 is filled with the coolant. The coolant is injected into the fluid microsystem 10 through the micro-driving member 41. It is noted that if the coolant is air, this step may be skipped.

Figure 13:
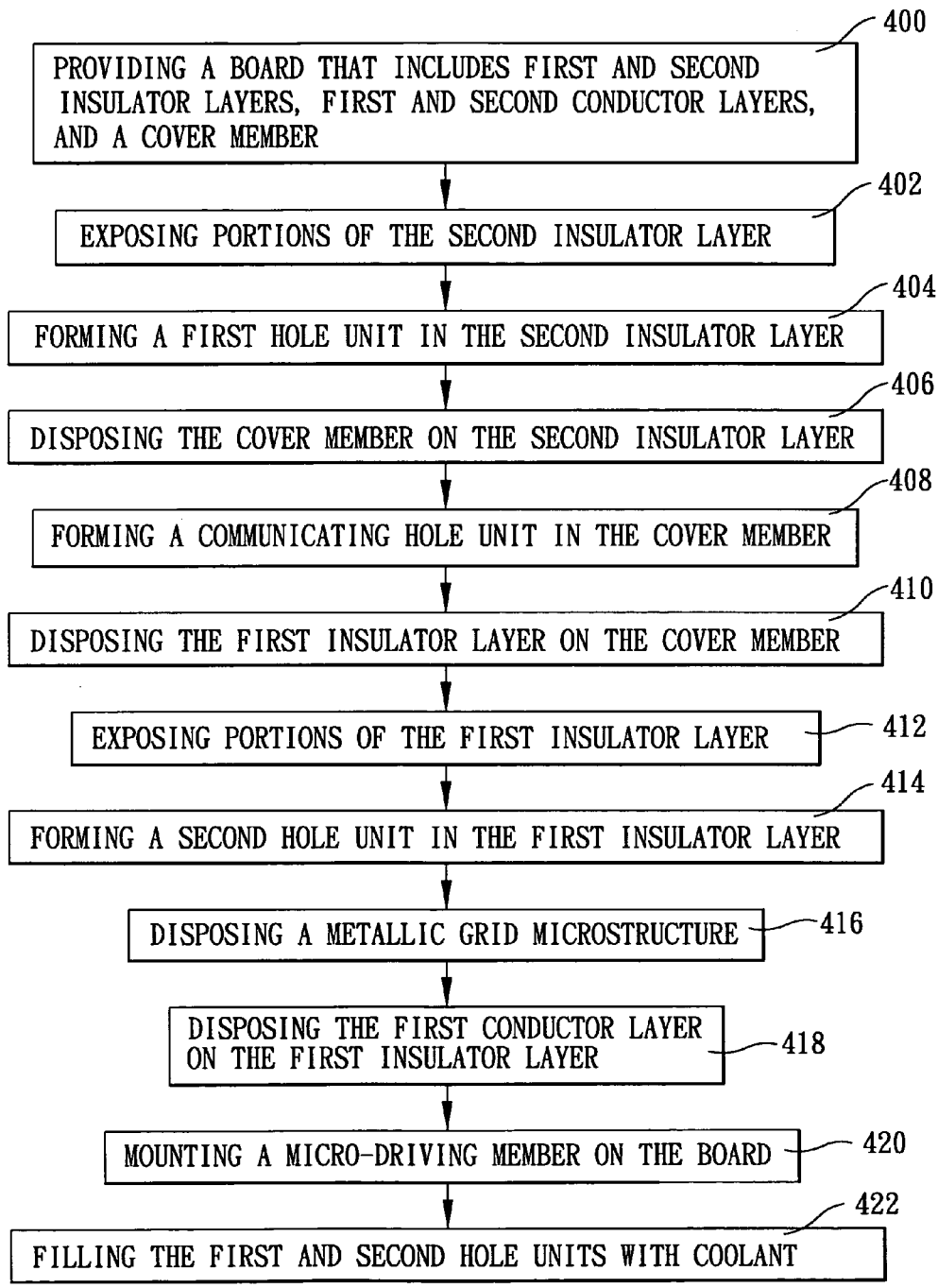
FIG. 13 is a flowchart of the second-preferred embodiment of a method of making the heat dissipating microdevice according to the present invention.

The preferred embodiment of a method for making the heat dissipating microdevice of FIG. 7 includes the steps shown in FIG. 13.

Figure 14:
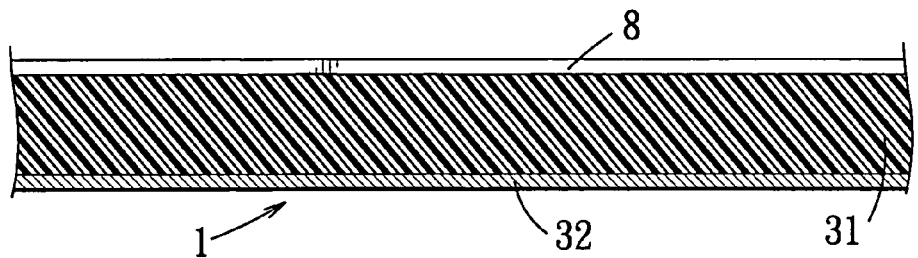
FIG. 14 is a fragmentary sectional view to illustrate a board having an insulator layer, and a conductor layer prepared according to the method of the second preferred embodiment.

In step 400, with further reference to FIG. 14, the board 1 is provided. The board 1 includes the first and second insulator layers 11,31, the first and second conductor layers 12, 32, and the cover member 2. Each of first and second insulator layers 11, 31 has the first surface and the second surface opposite to the first surface. The second conductor layer 32 is formed on the second surface of the second insulator layer 31, and a photo-resist layer 8 is coated on the first surface of the second insulator layer 31.

Figure 15:
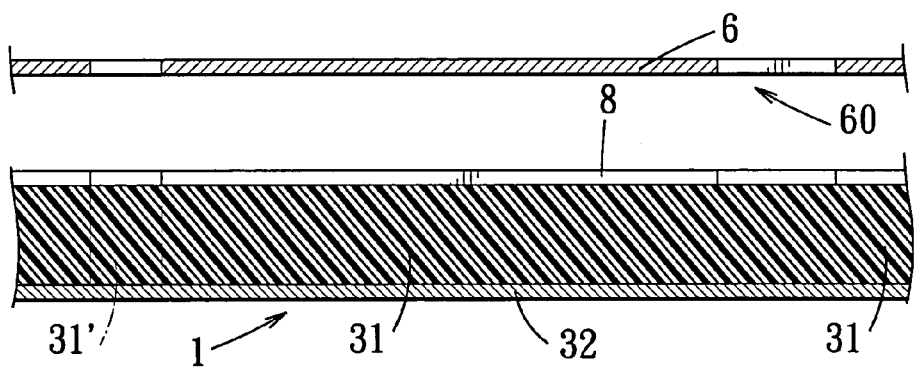
FIG. 15 is a fragmentary sectional view to illustrate how the insulator layer of the board of FIG. 14 is patterned in the method of the second preferred embodiment.

In step 402, with further reference to FIG. 15, the photo-resist layer 8 is patterned to expose portions 31' of the first surface of the second insulator layer 31. In this step, a photo-mask 6 is formed with a pattern 60 corresponding to the secondary fluid microsystem 10" (see FIG. 7) described hereinabove in connection with the fourth preferred embodiment. The board 1 is subsequently exposed to radiation for transferring the pattern 60 on the photo-mask 6 to the photo-resist layer 8. A developing solution is used to form recesses in the photo-resist layer 8 corresponding to the pattern 60.

Figure 16:
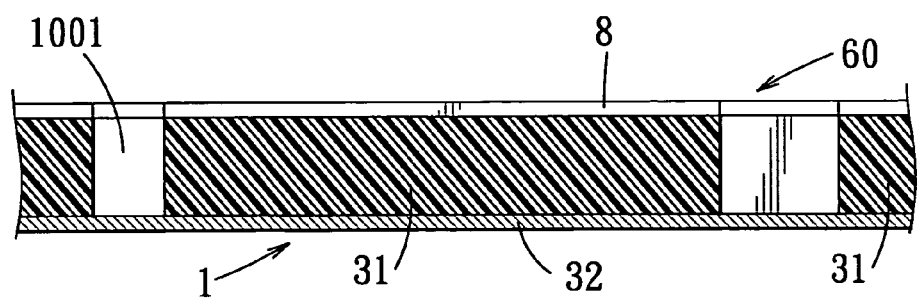
FIG. 16 is a fragmentary sectional view to illustrate how a first hole unit is formed in the insulator layer of the board of FIG. 15 according to the method of the second preferred embodiment.

In step 404, with further reference to FIG. 16, a first hole unit 1001 is formed in the exposed portions 31' (see FIG. 15) of the first surface of the second insulator layer 31. The first hole unit 1001 extends from the first surface to the second surface of the second insulator layer 31 so as to result in the secondary fluid microsystem bounded by the second conductor layer 32. Preferably, the first hole unit 1001 is formed by dry etching. Alternatively, the first hole unit 1001 can be formed by wet etching or laser ablation.

Figure 17:
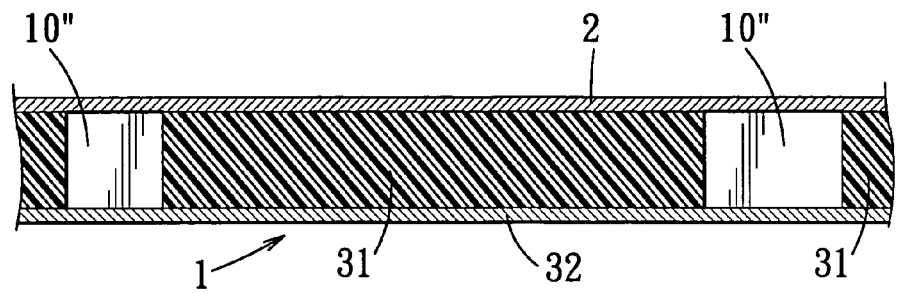
FIG. 17 is a fragmentary sectional view to illustrate how a cover member is disposed on the insulator layer of the board of FIG. 16 according to the method of the second preferred embodiment.

In step 406, with further reference to FIG. 17, the cover member 2 is disposed on the first surface of the second insulator layer 31.

Figure 18:
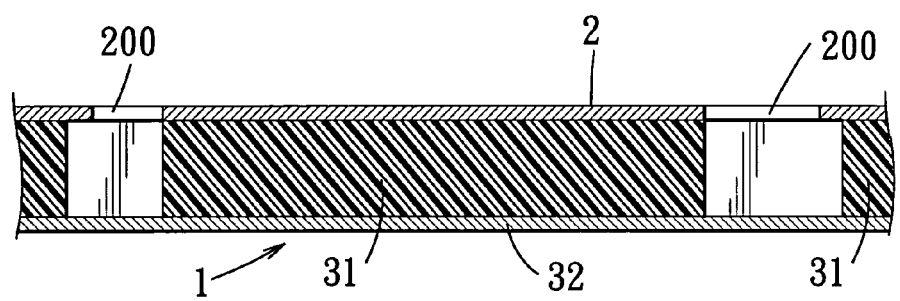
FIG. 18 is a fragmentary sectional view to illustrate how a communicating hole unit is formed in the cover member of FIG. 17 according to the method of the second preferred embodiment.

In step 408, with further reference to FIG. 18, the communicating hole unit 200 is formed in the cover member 2.

Figure 19:
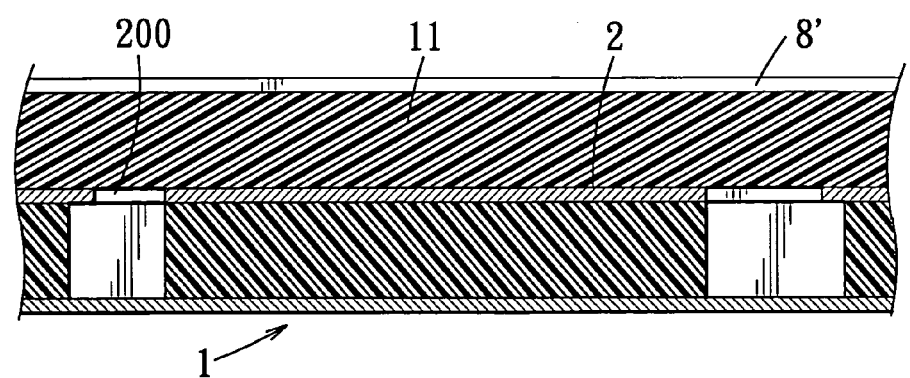
FIG. 19 is a fragmentary sectional view to illustrate an insulator layer disposed on the cover member of FIG. 18 according to the method of the second preferred embodiment.

In step 410, with further reference to FIG. 19, the first insulator layer 11 is disposed on the cover member 2 such that the second surface of the first insulator layer 11 lies on the cover member 2. A photo-resist layer 8' is coated on the first surface of the first insulator layer 11.

Figure 20:
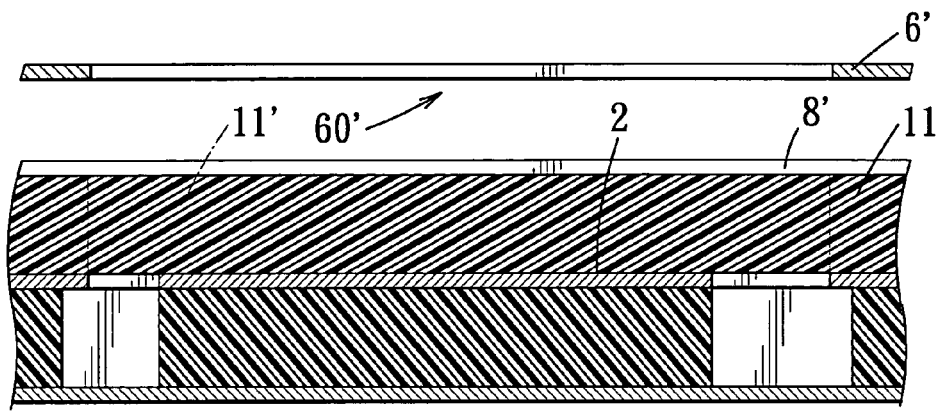
FIG. 20 is a fragmentary sectional view to illustrate how the insulator layer of FIG. 19 is patterned in the method of the second preferred embodiment.

In step 412, with further reference to FIG. 20, the photo-resist layer 8' is patterned to expose portions 11' of the first surface of the first insulator layer 11. In this step, a photo-mask 6' is formed with a pattern 60' that corresponds to the primary fluid microsystem 10' (see FIG. 7) described hereinabove in connection with the fourth preferred embodiment. The board 1 is subsequently exposed to radiation for transferring the pattern 60' on the photo-mask 6' to the photo-resist layer 8'. A developing solution is used to form recesses in the photo-resist layer 8' corresponding to the pattern 60'.

Figure 21:
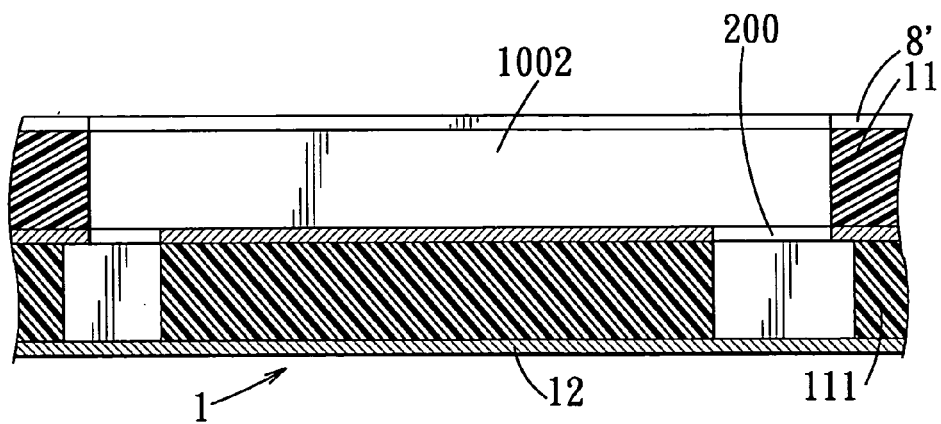
FIG. 21 is a fragmentary sectional view to illustrate how a second hole unit is formed in the insulator layer of FIG. 20 according to the method of the second preferred embodiment.

In step 414, with further reference to FIG. 21, a second hole unit 1002 is formed in the exposed portions 11' (see FIG. 20) of the first surface of the first insulator layer 11. The second hole unit 1002 extends from the first surface to the second surface of the first insulator layer 11 so as to result in the primary fluid microsystem that is bounded by the cover member 2. Preferably, the second hole unit 1002 is formed by dry etching. Alternatively, the second hole unit 1002 can be formed by wet etching or laser ablation.

Figure 22:
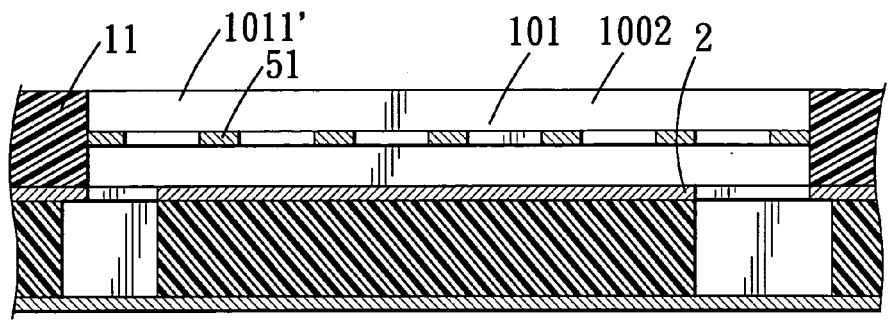
FIG. 22 is a fragmentary sectional view to illustrate how a metallic grid microstructure is disposed in a first micro-channel structure according to the method of the second preferred embodiment.

In step 416, with further reference to FIG. 22, the metallic grid microstructure 51 is disposed in the channel 1011' of the first micro-channel structure 101. It is noted that, in the alternative embodiment, the capillary protrusions 14 (see FIG. 5) are formed, such as by sintering, on the cover member 2 and the wall defining the channel 1011' of the first micro-channel structure 101.

Figure 23:
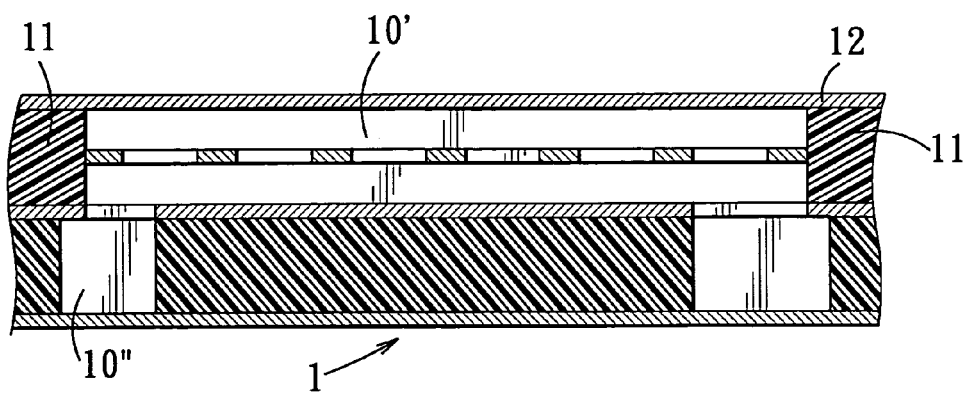
FIG. 23 is a fragmentary sectional view to illustrate a cover member disposed on the insulator layer to cover the first micro-channel structure of FIG. 22 according to the method of the second preferred embodiment.

In step 418, with further reference to FIG. 23, the first conductor layer 12 is disposed on the first surface of the first insulator layer 11 to seal the fluid microsystem. In the alternative embodiment, the capillary protrusions 14 are formed on the first conductor layer 12 before disposing the latter on the first surface of the first insulator layer 11.

In step 420, a micro-driving member 41 (see FIG. 3) is mounted on the board 1.

In step 422, the primary and secondary fluid microsystems 10', 10" are filled with a coolant. The coolant is injected into the primary and secondary fluid microsystems 10', 10" through the micro-driving member 41.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A heat dissipating microdevice comprising:
    a board including an insulator layer that has a first surface and a second surface facing said first surface in a first direction, a conductor layer formed on said first surface, and a cover member disposed on said second surface, said board having a first area and a second area facing said first area in a second direction transverse to the first direction, said first area being adapted to be placed in thermal contact with a heat source;
    a fluid microsystem formed in said insulator layer of said board, and including
    first and second micro-channel structures that are disposed respectively in said first and second areas of said board, at least one of said first and second micro-channel structures being bounded by at least one of said conductor layer and said cover member, said first micro-channel structure including a plurality of parallel channels, each of which includes first and second end positions,
    first and second micro-conduit structures that permit fluid communication between said first and second micro-channel structures, said first micro-conduit structure including a first end section in fluid communication with said second micro-channel structure and a second end section extending to and in fluid communication with said first end portions of said channels of said first micro-channel structure, said second micro-conduit structure including a first end section in fluid communication with said second end portions of said channels of said first micro-channel structure and a second end section extending to and in fluid communication with said second micro-channel structure, and
    the fluid microsystem further including a receiving microstructure that is disposed between and that permits fluid communication between said first micro-channel structure and said first micro-channel structure and second micro-conduit structure, that includes a first end portion extending to and in fluid communication with said second end portions of said channels of said first micro-channel structure and a second end portion extending to and in fluid communication with said first end section of said second micro-conduit structure, and that has a cross-section larger than those of said first micro-channel structure and said second micro-conduit structure, said first micro-channel structure including a plurality of parallel channels, each of which includes first and second end portions, said second end section of said first micro-conduit structure extending to said first end portion of said channel of said first micro-channel structure, said receiving microstructure having a diverging section that serves as said first end portion thereof and a converging section that serves as said second end portion thereof, said second end portions of said channels of said first micro-channel structure extending to said diverging section of said receiving microstructure, and
    a coolant contained in said fluid microsystem, said coolant flowing from said second micro-channel structure to said first micro-channel structure through said first micro-conduit structure, and from said first micro-channel structure back to said second micro-channel structure through said second micro-conduit structure.

2. The heat dissipating microdevice as claimed in claim 1, wherein said fluid microsystem further includes a mixing microstructure that is disposed between and that permits fluid communication between said receiving microstructure and said second micro-conduit structure, and that includes a first end portion extending to and in fluid communication with said second end portion of said receiving microstructure and a second end portion extending to and in fluid communication with said first end section of said second micro-conduit structure, and a third micro-conduit structure that is disposed between and that permits fluid communication between said first micro-conduit structure and said mixing microstructure, and that includes a first end portion extending to said first end section of said first micro-conduit structure and a second end portion extending to said mixing microstructure.

3. The heat dissipating microdevice as claimed in claim 2, wherein said second end portion of said third micro-conduit structure extends to said first end portion of said mixing microstructure.

4. The heat dissipating microdevice as claimed in claim 2, wherein said first end section of said second micro-conduit structure includes a plurality of parallel first conduits, each of which has first and second end portions,
    said first end portions of said first conduits of said first end section of said second micro-conduit structure extending to and being in fluid communication with said second end portion of said mixing microstructure,
    said second end portions of said first conduits of said first end section of said second micro-conduit structure being bifurcated to form a pair of branches,
    said second end section of said second micro-conduit structure including a plurality of parallel second conduits, each of which extends from one of said branches of a respective one of said first conduits.

5. The heat dissipating microdevice as claimed in claim 4, wherein each of said first conduits has a cross-section larger than that of said second conduits.

6. The heat dissipating microdevice as claimed in claim 4, wherein said fluid microsystem further includes a micro-reservoir structure that is disposed between and that is in fluid communication with said second micro-channel structure and said first micro-conduit structure.

7. The heat dissipating microdevice as claimed in claim 6, wherein said micro-reservoir structure has a cross-section larger than those of said second micro-channel structure and said first micro-conduit structure.

8. The heat dissipating microdevice as claimed in claim 6, wherein said second micro-channel structure includes a plurality of parallel channels, each of which extends between a respective one of said second conduits and said micro-reservoir structure.

9. The heat dissipating microdevice as claimed in claim 1, wherein said fluid microsystem further includes a micro-reservoir structure that is disposed between and that is in fluid communication with said second micro-channel structure and said first micro-conduit structure.

10. The heat dissipating microdevice as claimed in claim 9, wherein said micro-reservoir structure has a cross-section larger than those of said second micro-channel structure and said first micro-conduit structure.

11. The heat dissipating microdevice as claimed in claim 9, wherein said second micro-channel structure includes a plurality of parallel channels, each of which extends between said second micro-conduit structure and said micro-reservoir structure.

12. The heat dissipating microdevice as claimed in claim 1, further comprising a flow controller mounted on said board and operable so as to induce flow of said coolant in said fluid microsystem.

13. The heat dissipating microdevice as claimed in claim 12, wherein said flow controller includes a micro-driving member in fluid communication with said first micro-conduit structure.

14. The heat dissipating microdevice as claimed in claim 1, further comprising a micro-capillary member disposed in said first micro-channel structure for providing capillary action.

15. The heat dissipating microdevice as claimed in claim 14, wherein said micro-capillary member includes one of a metallic grid microstructure and a plurality of capillary protrusions formed on at least one of said cover member and said conductor layer.

16. The heat dissipating microsystem as claimed in claim 1, wherein said coolant is one of air, methanol, acetone, and water.

17. A heat dissipating microdevice comprising:
 a board including an insulator layer that has a first surface and a second surface facing said first surface in a first direction, a conductor layer formed on said first surface, and a cover member disposed on said second surface, said board having a first area and a second area facing said first area in a second direction transverse to the first direction, said first area being adapted to be placed in thermal contact with a heat source;
 a fluid microsystem formed in said insulator layer of said board, and including first and second micro-channel structures disposed respectively in said first and second areas of said board, at least one of said first and second micro-channel structures being bounded by at least one of said conductor layer and said cover member, and first and second micro-conduit structures that permit fluid communication between said first and second micro-channel structures said first micro-conduit structure including a first end section in fluid communication with said second micro-channel structure and a second end section extending to and in fluid communication with said first micro-channel structure, said second micro-conduit structure including a first end section in fluid communication with said first micro-channel structure and a second end section extending to and in fluid communication with said second micro-channel structure; and
 a coolant contained in said fluid microsystem, said coolant flowing from said second micro-channel structure to said first micro-channel structure through said first micro-conduit structure, and from said first micro-channel structure back to said second micro-channel structure through said second micro-conduit structure, said fluid microsystem further including:
 a mixing microstructure that is disposed between and that permits fluid communication between said first micro-channel structure and said second micro-conduit structure, and
 a third micro-conduit structure that is disposed between and that permits fluid communication between said first micro-conduit structure and said mixing microstructure, and that includes a first end portion extending to said first end section of said first micro-conduit structure and a second end portion extending to said mixing microstructure.

18. The heat dissipating microdevice as claimed in claim 17, wherein said first end section of said second micro-conduit structure includes a plurality of parallel first conduits, each of which has first and second end portions,
 said first end portions of said first conduits of said first end section of said second micro- conduit structure extending to and being in fluid communication with said mixing microstructure,
 said second end portions of said first conduits of said first end section of said second micro-conduit structure being bifurcated to form a pair of branches,
 said second end section of said second micro-conduit structure including a plurality of parallel second conduits, each of which extends from one of said branches of a respective one of said first conduits.

19. A heat dissipating microdevice comprising:
 a board including an insulator layer that has a first surface and a second surface opposite to said first surface in a first direction, a conductor layer formed on said first surface, and a cover member disposed on said second surface, said board having a first area and a second area opposite to said first area in a second direction transverse to the first direction, said first area being adapted to be placed in thermal contact with a heat source;
 a fluid microsystem formed in said insulator layer of said board, and including
 first and second micro-channel structures that are disposed respectively in said first and second areas of said board, at least one of said first and second micro-channel structures being bounded by at least one of said conductor layer and said cover member,
 first and second micro-conduit structures that permit fluid communication between said first and second micro-channel structures, said first micro-conduit structure including a first end section in fluid communication with said second micro-channel structure and a second end section extending to and in fluid communication with said first micro-channel structure, said second micro-conduit structure including a first end section in fluid communication with said first micro-channel structure and a second end section extending to and in fluid communication with said second micro-channel structure;
 a mixing microstructure that is disposed between and permits fluid communication between said first micro-channel structure and said second micro-conduit structure, and a third micro-conduit structure that is disposed between and that permits fluid communication between said first micro-conduit structure and said mixing microstructure, and that includes a first end portion extending to said first end section of said first micro-conduit structure and a second end portion extending to said mixing microstructure; and a coolant contained in said fluid microsystem, said coolant flowing from said second micro-channel structure to said first micro-channel structure through said first micro-conduit structure, and from said first micro-channel structure back to said second micro-channel structure through said second micro-conduit structure.

* * * * *